United States Patent
Park

(10) Patent No.: US 7,525,863 B2
(45) Date of Patent: Apr. 28, 2009

(54) LOGIC CIRCUIT SETTING OPTIMIZATION CONDITION OF SEMICONDUCTOR INTEGRATED CIRCUIT REGARDLESS OF FUSE CUT

(75) Inventor: Min-Sang Park, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 336 days.

(21) Appl. No.: 11/361,335

(22) Filed: Feb. 24, 2006

(65) Prior Publication Data

US 2006/0239100 A1 Oct. 26, 2006

(30) Foreign Application Priority Data

Apr. 25, 2005 (KR) .................. 10-2005-0034013

(51) Int. Cl.
 *G11C 17/18* (2006.01)
(52) U.S. Cl. .................. 365/225.7; 365/189.06; 365/189.07; 365/191
(58) Field of Classification Search .............. 365/225.7, 365/191, 189.06, 189.07
See application file for complete search history.

(56) References Cited

U.S. PATENT DOCUMENTS 5,781,485 A * 7/1998 Lee et al. .................... 365/201
6,392,909 B1 * 5/2002 Jang et al. ................. 365/225.7
6,459,652 B1 * 10/2002 Lee et al. ................ 365/233.14
6,704,228 B2 * 3/2004 Jang et al. .................... 365/200
6,711,077 B2 * 3/2004 Sung .......................... 365/201

FOREIGN PATENT DOCUMENTS

| JP | 05-041099 | 2/1993 |
|----|-----------|--------|
| JP | 2002-230993 | 8/2002 |
| KR | 1998-032975 | 7/1998 |
| KR | 2002-0062438 | 7/2002 |

OTHER PUBLICATIONS

English language abstract of Korean Publication No. 1998-032975.
English language abstract of Japanese Publication No. 2002-230993.
English language abstract of Japanese Publication No. 05-041099.

* cited by examiner

*Primary Examiner*—Pho M. Luu
(74) *Attorney, Agent, or Firm*—Marger Johnson & McCollom, P.C.

(57) ABSTRACT

Provided is a circuit for setting an optimized condition of a semiconductor circuit including a fuse cut signal generator configured to generate a fuse cut signal in response to a first control signal, and a state setting circuit configured to generate an optimization signal in response to a plurality of state control signals and the fuse cut signal.

26 Claims, 4 Drawing Sheets

LOGIC CIRCUIT SETTING OPTIMIZATION CONDITION OF SEMICONDUCTOR INTEGRATED CIRCUIT REGARDLESS OF FUSE CUT

CROSS-REFERENCE TO RELATED PATENT APPLICATION

This application claims the benefit of Korean Patent Application No. 10-2005-0034013, filed on Apr. 25, 2005, in the Korean Intellectual Property Office, the disclosure of which is incorporated herein in its entirety by reference.

BACKGROUND OF THE INVENTION

1. Field of the Invention

This disclosure relates to a semiconductor integrated circuit, and more particularly, to a logic circuit capable of testing and optimizing a semiconductor integrated circuit as if fuses are not cut without being affected by fuses cut for a primary test and optimization of the semiconductor integrated circuit.

2. Description of the Related Art

A semiconductor integrated circuit that has passed through a semiconductor fabrication process may pass an electrical characteristic test and a functional test while it is in a wafer state. The electrical characteristic test may measure parameters of transistors, resistors and capacitors using test patterns of the semiconductor integrated circuit. The functional test tests the operation of the semiconductor integrated circuit. The internal logic scheme of the semiconductor integrated circuit may be changed or a delay time controlled to optimize the operation of the semiconductor integrated circuit based on the electrical characteristic test and functional test results.

A method of changing the internal logic scheme or controlling the delay time is carried out through a fuse test logic circuit including fuses. The fuse test logic circuit is part of the semiconductor integrated circuit. The fuse test logic circuit selectively cuts the fuses and changes the internal logic scheme or controls the delay time in response to the cut fuses.

FIG. 1 is a circuit diagram of a conventional fuse test logic circuit 100. Referring to FIG. 1, the fuse test logic circuit 100 includes a PMOS transistor 101, a fuse 102, and an NMOS transistor 103, which are serially connected between a power supply voltage VDD and a ground voltage VSS. The gates of the PMOS transistor 101 and NMOS transistor 103 receive a power stabilizing signal PVCCHB. The power stabilizing signal PVCCHB transitions from a logic high level to a logic low level when the operating power of a semiconductor integrated circuit including the logic circuit 100 has stabilized.

The fuse test logic circuit 100 further includes a first inverter 104 connected to a node NA between the fuse 102 and the NMOS transistor 103, a NOR gate 105 receiving the output signal of the first inverter 104 and a TMRS pointer TMRS, and a second inverter 106 receiving the output signal of the NOR gate 105 and outputting a fuse test on signal Fuse_Test_ON. The TMRS pointer TMRS is a test signal set in a mode register MRS in a test mode. The fuse test on signal Fuse_Test_ON having a logic high level is generated when the TMRS pointer TMRS has a logic high level.

The fuse test logic circuit 100 determines the logic level of the fuse test on signal Fuse_Test_ON in response to the output signal of the first inverter 104 and the TMRS pointer TMRS, inputted to the NOR gate 105. The output signal of the first inverter 104 is determined in response to whether the fuse 102 is cut and the power stabilizing signal PVCCHB having a logic low level. The output signal of the first inverter 104 has a logic low level when the fuse 102 is not cut and has a logic high level when the fuse 102 is cut. As a result, the fuse test on signal Fuse_Test_ON has a logic high level when the TMRS pointer TMRS has a logic high level when the fuse 102 is not cut, and has a logic high level when the output signal of the first inverter 104 has a logic high level when the fuse 100 is cut. The fuse test on signal Fuse_Test_ON at a logic high level serves as a control signal for changing the internal logic scheme of the semiconductor integrated circuit or controlling delay time.

The semiconductor integrated circuit including the fuse test logic circuit 100 can judge that there is a need to change the internal logic scheme or control delay time in response to the results of tests carried out on the semiconductor integrated circuit while it is in a wafer state. Then, the fuse test logic circuit 100 selectively cuts the fuse 102 to generate the fuse test on signal Fuse_Test_ON having a logic high level. The fuse test on signal Fuse_Test_ON at a logic high level changes the internal logic scheme of the semiconductor integrated circuit or controls the delay time while the semiconductor integrated circuit in a wafer state is tested.

The semiconductor integrated circuit that has been tested in its wafer state is tested again after being packaged. The fuse test logic circuit 100 having the cut fuse 102 in the wafer state generates the fuse test on signal Fuse_Test_ON having a logic high level all the time while a package test of the semiconductor integrated circuit is performed. That is, the fuse test on signal Fuse_Test_ON at a logic high level, which is set to change the internal logic scheme of the semiconductor integrated circuit or control the delay time in response to the wafer test result, is also applied to the package test. Accordingly, the package test is performed on the semiconductor integrated circuit having the changed internal logic scheme or controlled delay time.

However, even though the fuse 102 was cut in response to the wafer test result to change the internal logic scheme or control the delay time such that the operation of the semiconductor integrated circuit was optimized, there is often a need to carry out the package test while the fuse 102 is not cut, that is, the internal logic scheme of the semiconductor integrated circuit is not varied or the delay time is not controlled. This is because of the variation of environmental parameters during the test of a packaged semiconductor integrated circuit may result in a situation in which the optimization condition of the semiconductor integrated circuit should be re-set. For this, there is a need to perform the package test while the fuse 102 is not cut.

When the fuse test logic circuit 100 cuts the fuse 102 once during the wafer test, information about the cut fuse continuously affects the circuit through the package test. Thus, a semiconductor integrated circuit having a fuse test logic circuit 100 with an uncut fuse 102 should be manufactured again if the circuit having no cut fuse is needed. Accordingly, a long period of time is taken to optimize the semiconductor integrated circuit due to the time required for the semiconductor fabrication process.

SUMMARY OF THE INVENTION

An embodiment includes a circuit for setting an optimized condition of a semiconductor circuit including a fuse cut signal generator configured to generate a fuse cut signal in response to a first control signal, and a state setting circuit configured to generate an optimization signal in response to a plurality of state control signals and the fuse cut signal.

Another embodiment includes a method of testing a semiconductor circuit having a fuse including cutting the fuse, generating an optimization signal in the semiconductor circuit corresponding to the fuse being uncut, and testing the semiconductor circuit.

BRIEF DESCRIPTION OF THE DRAWINGS

The above and other features and advantages of the invention will become more apparent by describing in detail exemplary embodiments thereof with reference to the attached drawings in which.

DETAILED DESCRIPTION OF THE INVENTION

Figure 1:
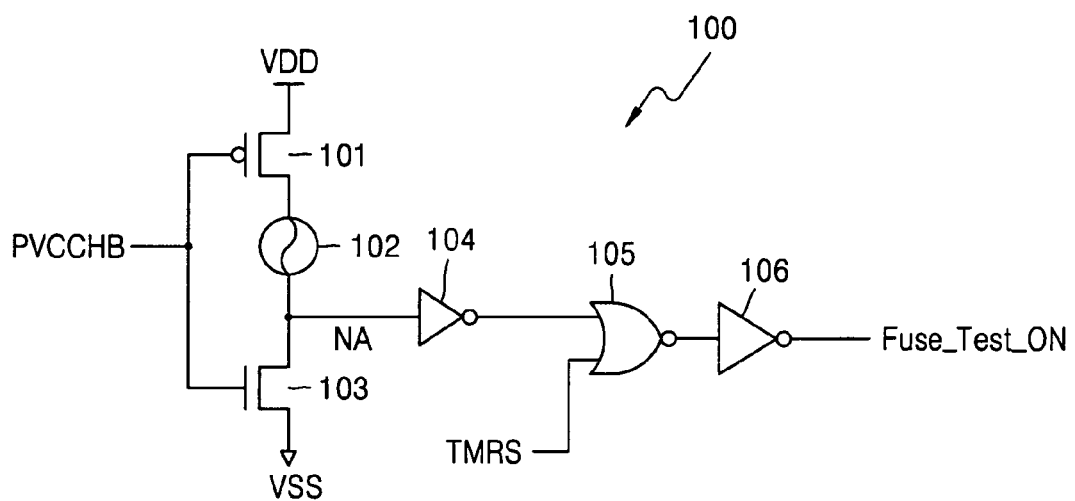
FIG. 1 is a circuit diagram of a conventional fuse test logic circuit.

Embodiments will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Throughout the drawings, like reference numerals refer to like elements.

Figure 2:
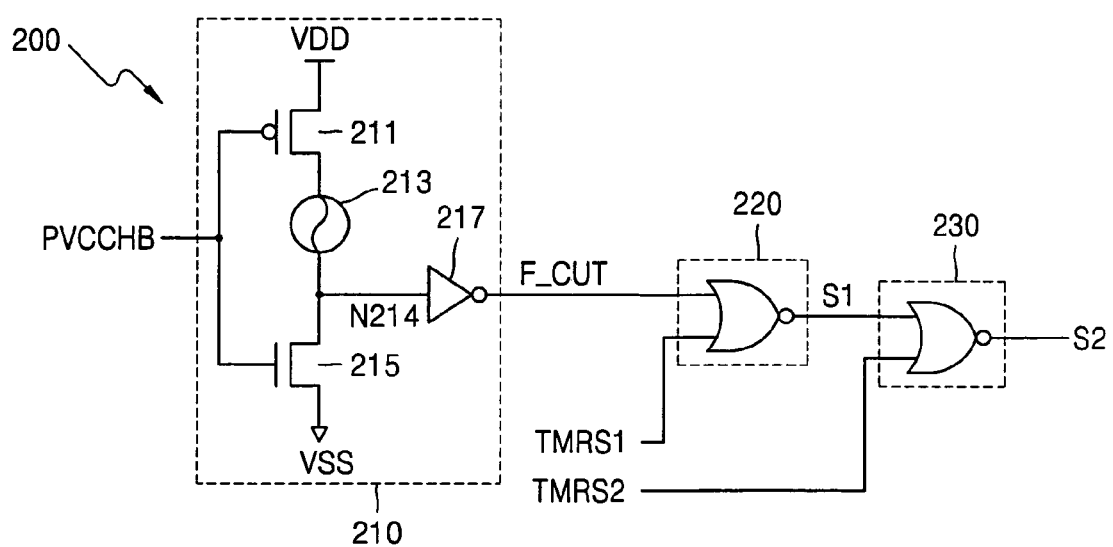
FIG. 2 is a circuit diagram of a logic circuit according to a first embodiment.

FIG. 2 is a circuit diagram of a logic circuit 200 according an embodiment. The logic circuit 200 may be set as if a fuse is not cut even though the fuse has been cut. The logic circuit 200 includes a fuse cut signal generator 210, a first state setting part 220 and a second state setting part 230.

The fuse cut signal generator 210 includes a first transistor 211, a fuse 213, and a second transistor 215 serially connected between a power supply voltage VDD and a ground voltage VSS. The first transistor 211 may be a PMOS transistor and the second transistor 215 may be an NMOS transistor. The gates of the first and second transistors 211 and 215 receive a power stabilizing signal PVCCHB. The fuse cut signal generator 210 further includes an inverter 217 whose input port is connected to a node N214 between the fuse 213 and the second transistor 215. The inverter 217 outputs a fuse cut signal F_CUT.

The first state setting part 220 receives the fuse cut signal F_CUT of the fuse cut signal generator 210 and a select control signal TMRS1 to generate a first state signal S1. The first state setting part 220 may be a NOR gate. The select control signal TMRS1 may be a first test signal set to a mode register MRS in a test mode. Alternatively, the select control signal TMRS1 may be a signal provided by a select control signal generating circuit of FIG. 3, which will be explained later.

The second state setting part 230 receives the first state signal S1 of the first state setting part 220 and a de-select control signal TMRS2 to generate a second state signal S2.

The de-select control signal TMRS2 may be a second test signal set to the mode register MRS in the test mode or a signal generated by a de-select control signal generating circuit of FIG. 4, which will be explained later. The second state setting part 230 may be a NOR gate. The second state signal S2 has the same function as the fuse test on signal Fuse_Test_ON of FIG. 1. That is, the second state signal S2 is used to change the internal logic scheme of a semiconductor integrated circuit including the logic circuit 200 or control delay time.

The operation of the logic circuit 200 will now be explained.

When the logic circuit 200 is in its initial state in which the fuse 213 is not cut, the first transistor 211 is turned on and the second transistor is turned off in response to the power stabilizing signal PVCCHB shifted from a logic high level to a logic low level. The power supply voltage VDD is transferred to the node N214 through the turned on first transistor 211 and the fuse 213 such that the node N214 is at a logic high level. The node N214 at a logic high level generates the fuse cut signal F_CUT having a logic low level through the inverter 217.

The first state setting part 220 receiving the fuse cut signal F_CUT having a logic low level generates the first state signal S1 in response to the logic level of the select control signal TMRS1. The first state setting part 220 generates a logic high level on the first state signal S1 when the select control signal TMRS1 is at a logic low level and generates a logic low level on the first state signal S1 when the select control signal TMRS1 is at a logic high level. The second state setting part 230 generates a logic low level on the second state signal S2 in response to a logic high level on the first state signal S1. The second state signal S2 at a logic low level means that there is no need to change the internal logic scheme of the semiconductor integrated circuit or control the delay time.

The second state setting part 230 receiving a logic low level on the first state signal S1 generates the second state signal S2 in response to the logic level of the de-select control signal TMRS2. Specifically, the second state setting part 230 generates a logic high level on the second state signal S2 when the de-select control signal TMRS2 has a logic low level and generates a logic low level on the second state signal S1 when the de-select control signal TMRS2 has a logic high level. As described above, the second state signal S2 at a logic low level represents that there is no need to change the internal logic scheme or control the delay time because the operation of the semiconductor integrated circuit has been optimized. The second state signal S2 at a logic high level represents that there is a need to change the internal logic scheme of the semiconductor integrated circuit or control the delay time. Accordingly, the logic circuit 200 varies the internal logic scheme or control the delay time to optimize the operation of the semiconductor integrated circuit.

When the fuse 123 is not cut, the fuse cut signal F_CUT having a logic low level is generated. The select control signal TMRS1 having a logic high level and the de-select control signal TMRS2 having a logic low level are provided to the logic circuit 200 when it is determined that optimization of the operation of the semiconductor integrated circuit is required when the semiconductor integrated circuit is tested. Accordingly, the logic circuit 200 generates a logic high level on the second state signal S2 to change the internal logic scheme or control the delay time to optimize the operation of the semiconductor integrated circuit.

When optimization of the operation of the semiconductor integrated circuit is not required when the semiconductor integrated circuit is tested when the fuse 213 is not cut, the select control signal TMRS1 having a logic low level is provided to the logic circuit 200. Here, the de-select control signal TMRS2 can have a logic low level or a logic high level. Accordingly, the logic circuit 200 generates the second state signal S2 having a logic low level such that the internal logic scheme is not changed or the delay time is not controlled.

The operation of the logic circuit 200 when the fuse 213 is cut will now be explained. The fuse 213 is cut when optimization of the operation of the semiconductor integrated circuit is required in a primary test of the semiconductor integrated circuit. The second transistor 215 of the fuse cut signal generator 210 is turned on and the node N214 becomes a logic low level in response to the power stabilizing signal PVCCHB. The inverter 217 receives the logic low signal of the node N214 and generates the fuse cut signal F_CUT having a logic high level.

The first state setting part 220 generates the first state signal S1 having a logic low level in response to the fuse cut signal F_CUT having a logic high level. The second state setting part 230 receiving the first state signal S1 having a logic low level generates the second state signal S2 in response to the logic level of the de-select control signal TMRS2. The second state setting part 230 generates a logic high level on the second state signal S2 when the de-select control signal TMRS2 has a logic low level and generates a logic low level on the second state signal S2 when the de-select control signal TMRS2 has a logic high level. The second state signal S2 having a logic low level represents that there is no need to change the internal logic scheme or control the delay time because the operation of the semiconductor integrated circuit has been optimized. The second state signal S2 having a logic high level represents that it is required that the internal logic scheme of the semiconductor integrated circuit is changed or the delay time is controlled.

The fuse cut signal F_CUT having a logic high level is generated when the fuse 213 is cut. When it is determined that optimization of the operation of the semiconductor integrated circuit is required in a secondary test, the de-select control signal TMRS2 having a logic low level is provided to the logic circuit 200. Accordingly, the logic circuit 200 generates a logic high level on the second state signal S2 to change the internal logic scheme or control the delay time to optimize the operation of the semiconductor integrated circuit.

In the case where the fuse has been cut 213, when a user wants to test the semiconductor integrated circuit as if the fuse 213 is not cut in the secondary test, the de-select control signal TMRS2 having a logic high level is provided to the logic circuit 200. Here, regardless of a logic low level or logic high level on the select control signal TMRS1, the logic circuit 200 generates the second state signal S2 having a logic low level. Thus, the semiconductor integrated circuit can be tested in the secondary test as if the fuse 213 is not cut even though the fuse 213 has been cut for optimization of the operation of the semiconductor integrated circuit in the primary test.

Accordingly, the logic circuit 200 may be set in a state as if the fuse 213 is not cut, whether or not the fuse 213 has been cut, using the de-select control signal TMRS2.

Figure 3:
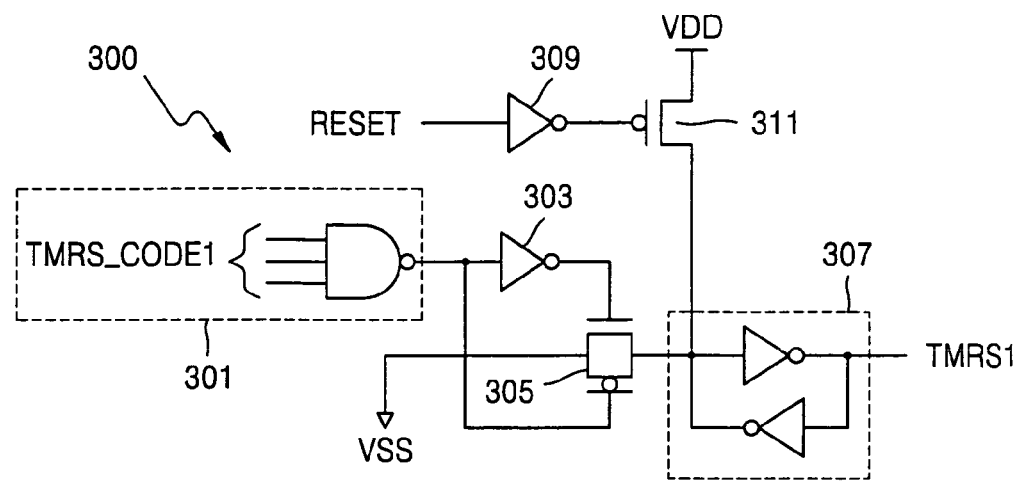
FIG. 3 is a circuit diagram of a circuit generating the select control signal of FIG. 2.

FIG. 3 is a circuit diagram of a circuit 300 generating the select control signal TMRS1. Referring to FIG. 3, the select control signal generating circuit 300 includes a first decoder 301, a first inverter 303, a transfer gate 305, and a latch 307. The first decoder 301 decodes first test mode code signals TMRS_CODE1 and transfers the decoded result to the first inverter 303. The first test mode code signals TMRS_CODE1 are bit signals stored in the mode register when a test is carried out. The transfer gate 305 transfers a ground voltage VSS to the latch 307 in response to the output of the first inverter 303 and the output of the first decoder 301.

The select control signal generating circuit 300 further includes a second inverter 309 receiving a reset signal RESET and a PMOS transistor 311 having a gate receiving the output of the second inverter, a source connected to a power supply voltage VDD and a drain connected to a node N306 between the transfer gate 305 and the latch 307.

In the select control signal generating circuit 300, the first decoder 301 outputs a signal having a logic low level when all the first test mode code signals TMRS_CODE1 have a logic high level. The transfer gate 305 is turned on in response to the output signal of the first decoder 301 having a logic low level and the output signal of the first inverter 303 having a logic low level to transfer the ground voltage VSS to the latch 307. The latch 307 generates the select control signal TMRS1 having a logic high level.

When at least one of the first test mode code signals TMRS_CODE1 has a logic low level, the first decoder 301 outputs a signal having a logic high level. The transfer gate 305 is turned off in response to the output signal of the first decoder 301 having a logic high level and the output signal of the first inverter having a logic low level. The latch 307 latches the previous logic state of the select control signal TMRS1. Here, the reset signal RESET can be activated in order to set the logic state of the select control signal TMRS1. The second inverter 309 outputs a signal having a logic low level in response to the reset signal RESET having a logic high level. The PMOS transistor 311 is turned on in response to the output signal of the second inverter 309 having a logic low level to transfer a logic high signal to the latch 307. Accordingly, the latch 307 generates the select control signal TMRS1 having a logic low level.

Figure 4:
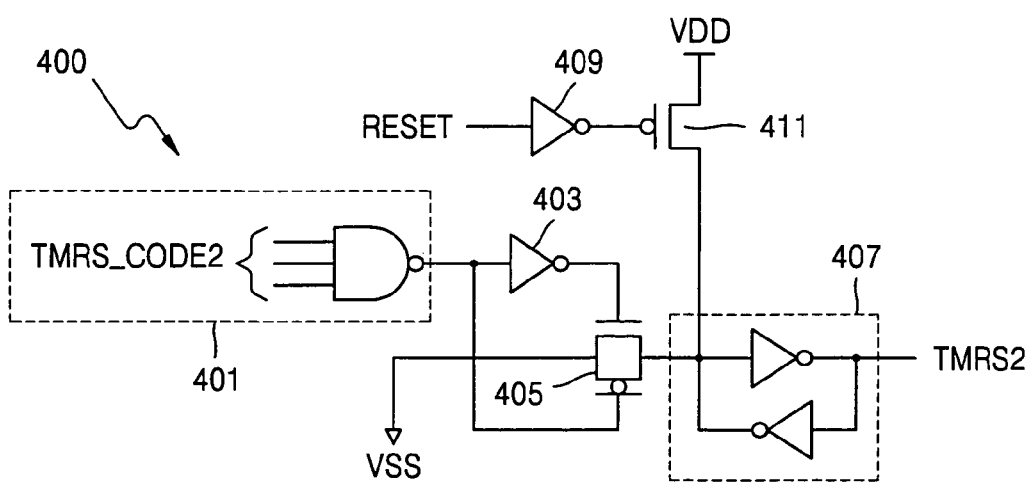
FIG. 4 is a circuit diagram of a circuit generating the de-select control signal of FIG. 2.

FIG. 4 is a circuit diagram of a circuit 400 generating the de-select control signal. Referring to FIG. 4, the de-select control signal generating circuit 400 includes a second decoder 401, a first inverter 403, a transfer gate 405, a latch 407, a second inverter 409, and a PMOS transistor 411. The second decoder 401 decodes second test mode code signals TMRS_CODE2 and transfers the decoded result to the first inverter 403. The second test mode code signals TMRS_CODE2 are bit signals stored in the mode register when the semiconductor integrated circuit is tested. The transfer gate 405 transfers the ground voltage VSS to the latch 407 in response to the output of the first inverter 403 and the output of the first decoder 401. The second inverter 409 receives a reset signal RESET and transfers its output signal to the gate of the PMOS transistor 411. When the PMOS transistor 411 is turned on in response to the reset signal RESET having a logic high level, the PMOS transistor 411 transfers the power supply voltage having a logic high level to the latch 407. The latch 407 latches the ground voltage having a logic low level transferred through the transfer gate to generate the de-select control signal TMRS2 having a logic high level. Alternatively, the latch 407 latches the logic high signal transferred through the PMOS transistor 411 to generate the de-select control signal TMRS2 having a logic low level.

Figure 5:
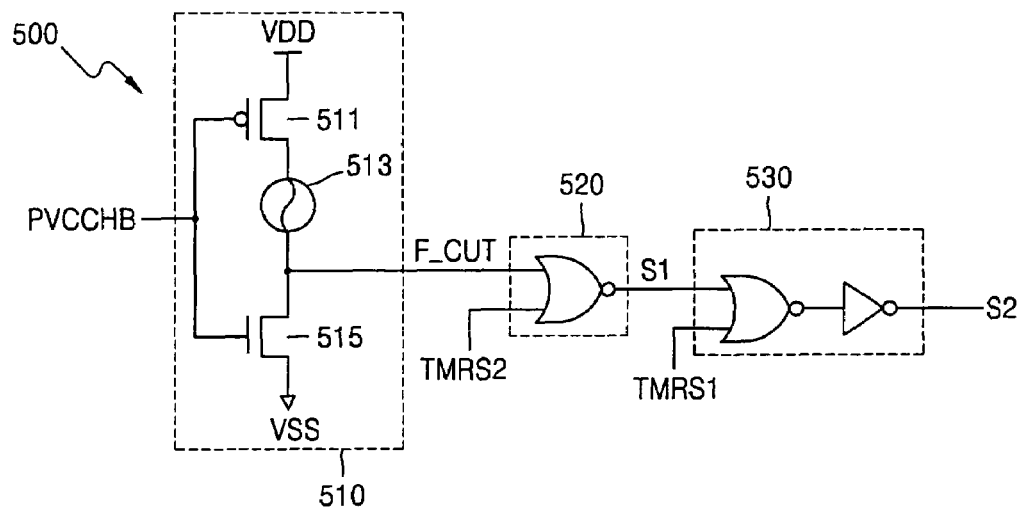
FIG. 5 is a circuit diagram of a logic circuit according to a second embodiment.

FIG. 5 is a circuit diagram of a logic circuit 500 according to another embodiment. Referring to FIG. 5, the logic circuit 500 includes a fuse cut signal generator 510 generating a fuse cut signal F_CUT in response to a power stabilizing signal PVCCHB, a first state setting part 520 receiving the fuse cut signal F_CUT and a de-select control signal TMRS2 to generate a first state signal S1, and a second state setting part 530 receiving the first state signal S1 and a select control signal TMRS1 to generate a second state signal S2.

The logic circuit 500 is similar to the logic circuit 200 of FIG. 2. The fuse cut signal generator 510 is similar to the fuse cut signal generator 210 of FIG. 2. The first state setting part 520 may be a NOR gate receiving the fuse cut signal F_CUT and the de-select control signal TMRS2, and the output of the NOR gate corresponds to the first state signal S1. The second state setting part 530 may be a NOR gate receiving the first state signal S1 and the select control signal TMRS1 and an inverter receiving the output of the NOR gate to generate the second state signal S2.

The operation of the logic circuit 500 is similar to that of the logic circuit 200 of FIG. 2 so that detailed explanation of some portions is omitted. However, the logic circuit 500 is distinguished from the logic circuit 200 in that the select control signal TMRS1 is set to a logic low level and the de-select control signal TMRS2 is set to a logic high level to generate a logic low level on the second state signal S2 when the fuse 513 is cut while the logic circuit 200 sets only the de-select control signal TMRS2 to a logic high level to generate a logic low level on the second state signal S2 when the fuse 213 is cut.

The above-described logic circuits 200 and 500 generate the second state signal S2 in response to whether the fuse 513 is cut or the logic level of the select TMRS1 or de-select control signal TMRS2. The second state signal S2 is used to change individual items for optimizing the semiconductor integrated circuit. The individual items may include changing a logic level on a signal line or controlling delay time.

Figure 6:
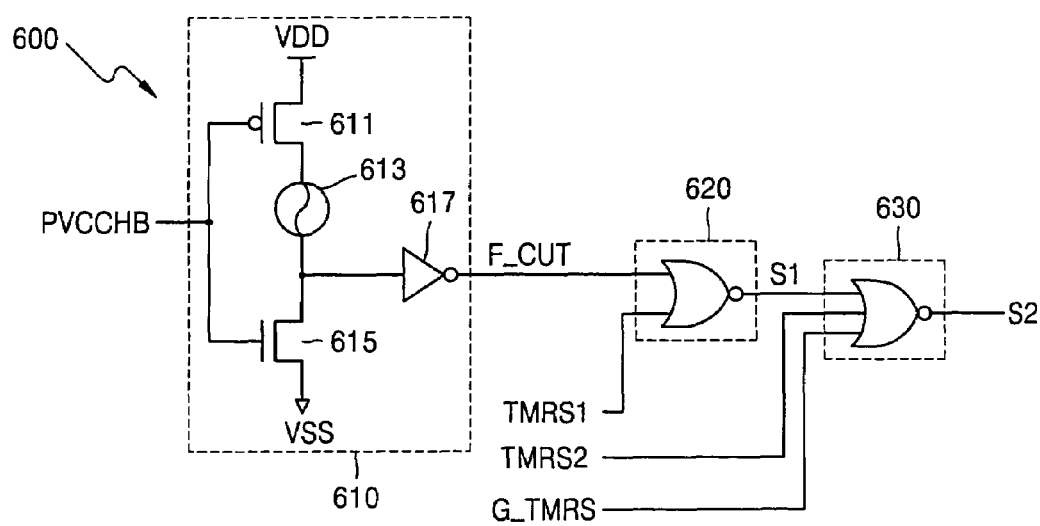
FIG. 6 is a circuit diagram of a logic circuit according to a third embodiment.

FIG. 6 is a circuit diagram of a logic circuit 600 according to another embodiment. Referring to FIG. 6, the logic circuit 600 changes a group of related individual items for optimization of the semiconductor integrated circuit. The items of the group may include changing logic levels on signal lines or changing delay times. The logic circuit 600 includes a fuse cut signal generator 610 generating a fuse cut signal F_CUT in response to a power stabilizing signal PVCCHB, a first state setting part 620 receiving the fuse cut signal F_CUT and a select control signal TMRS1 to generate a first state signal S1, and a second state setting part 630 receiving the first state signal S1, a de-select control signal TMRS2 and a group select control signal G_TMRS to generate a second state signal S2.

The fuse cut signal generator 610 and the first state setting part 620 are similar to the fuse cut signal generator 210 and the first state setting part 220 of FIG. 2. The second state setting part 630 may be a 3-input NOR gate receiving the first state signal S1, the de-select control signal TMRS2, and the group select control signal G_TMRS. The output of the 3-input NOR gate corresponds to the second state signal S2. The group select control signal G_TMRS may be a signal stored in a mode register for controlling group items when a test is performed.

The logic circuit 600 controls one of signal lines belonging to a group item. The logic circuit 600 sets the second state signal S2 to a logic high level when a fuse 613 is cut and the de-select control signal TMRS2 and the group select control signal G_TMRS are a logic low level. The second state signal S2 having a logic high level changes the logic level of a corresponding signal line or varies a delay time. Furthermore, the logic circuit 600 sets the second state signal S2 to a logic low level when the de-select control signal TMRS2 or the group select control signal G_TMRS are a logic high level.

The generation of the second state signal S2 having a logic low level in response to the de-select control signal TMRS2 having a logic high level means that the logic level of only a corresponding signal line is not changed or delay time is not controlled when a test is performed. The generation of the second state signal S2 having a logic low level in response to the group select control signal G_TMRS having a logic high level means that the logic levels of all the signal lines belonging to a group item are not changed or delay time is not controlled.

Figure 7:
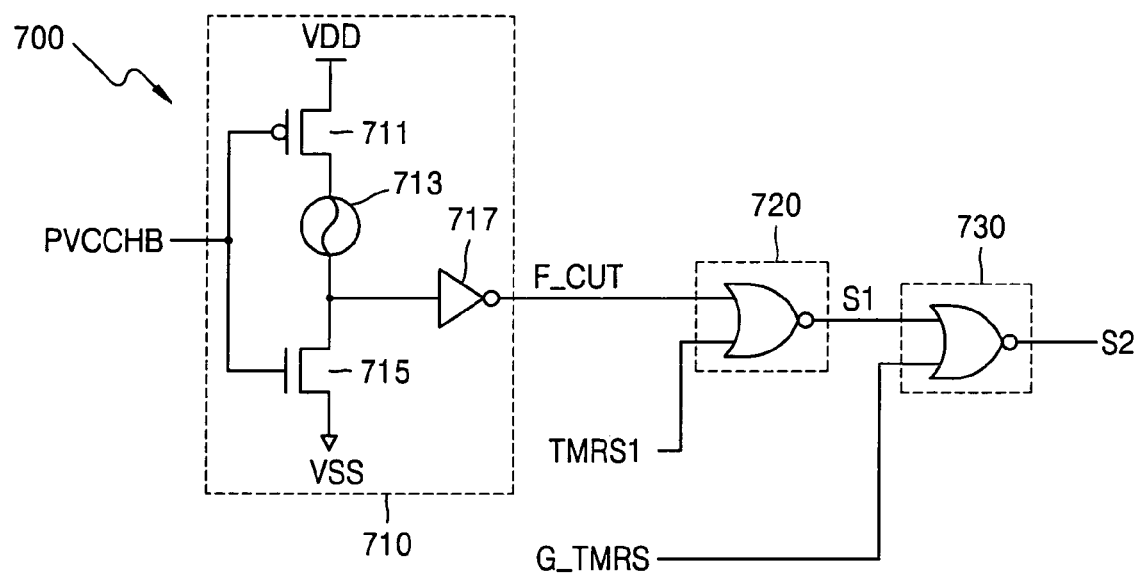
FIG. 7 is a circuit diagram of a logic circuit according to a fourth embodiment.

FIG. 7 is a circuit diagram of a logic circuit 700 according to another embodiment. Referring to FIG. 7, the logic circuit 700 is distinguished from the logic circuit 600 of FIG. 6 in that the second state setting part 730 is composed of a 2-input NOR gate receiving the first state signal S1 and the group select control signal G_TMRS to generate the second state signal S2.

The logic circuit 700 generates the first state signal S1 having a logic low level when a fuse 713 is cut. When the group select control signal G_TMRS having a logic low level is provided, the second state signal S2 having a logic high level is generated to control the logic level of signal lines or control delay times for the group items. When the group select control signal G_TMRS having a logic high level is provided, the second state signal S2 having a logic low level is generated such that the logic circuit 700 does not change the logic levels of all the signal lines belonging to a corresponding group item or control delay time.

Accordingly, the logic circuit 700 sets the group select control signal G_TMRS to a logic high level such that a corresponding signal line is not affected by the fuse 713 even though the fuse 713 has been cut. Furthermore, the group select control signal G_TMRS having a logic high level allows all the signal lines belonging to a corresponding group item not to be affected by a cut fuse.

Figure 8:
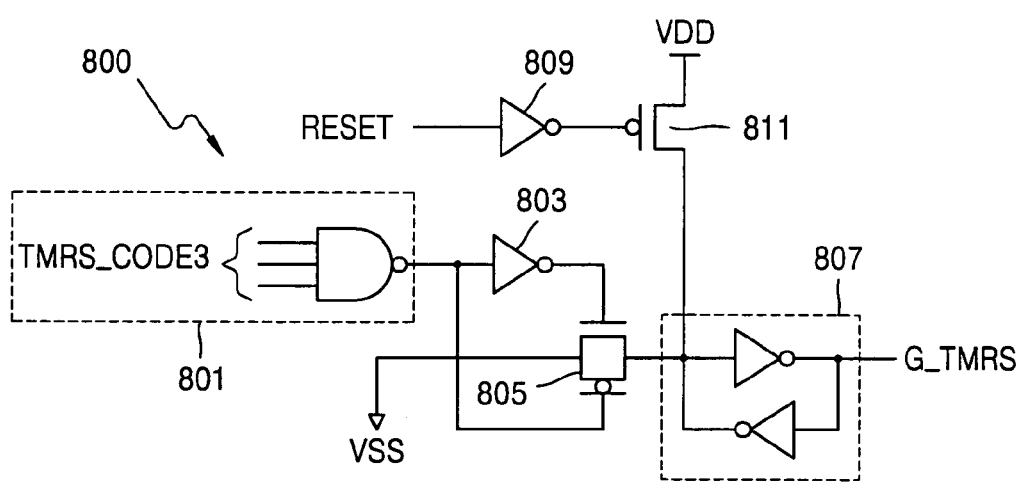
FIG. 8 is a circuit diagram of a circuit generating the group select control signal of FIGS. 6 and 7.

FIG. 8 is a circuit diagram of a circuit 800 generating the group select control signal G_TMRS of FIG. 6 or 7. Referring to FIG. 8, the group select control signal generating circuit 800 includes a third decoder 801, a first inverter 803, a transfer gate 805, a latch 807, a second inverter 809, and a PMOS transistor 811. Only the third decoder 801 is distinguished from the first and second decoders 301 and 401 in that the third decoder 801 decodes group test mode code signals TMRS_CODE3 and transfers the decoded result to the first inverter 803, and other components of the circuit 800 are similar to those of the circuits 300 and 400 of FIGS. 3 and 4. Thus, explanations for the other components are omitted for convenience.

While the invention has been particularly shown and described with reference to exemplary embodiments thereof, it will be understood by those of ordinary skill in the art that various changes in form and details may be made therein without departing from the spirit and scope of the invention as defined by the following claims.

What is claimed is:

1. A circuit for setting an optimized condition of a semiconductor circuit comprising:
    a fuse cut signal generator configured to generate a fuse cut signal in response to a first control signal; and
    a state setting circuit configured to generate an optimization signal in response to a plurality of state control signals and the fuse cut signal;
    wherein the state setting circuit further comprises:
        a first state setting part coupled to the fuse cut signal generator and configured to receive a first state control signal; and
        a second state setting part coupled to the first state setting part and configured to receive a second state control signal and to generate the optimization signal.

2. The circuit of claim 1, wherein the state setting circuit further comprises a plurality of state setting parts including the first state setting part and the second state setting part, each state setting part coupled to at least one other state setting part and coupled to at least one of the state control signals.

3. The circuit of claim 1, wherein:
the first state setting part further comprises a NOR gate; and
the second state setting part further comprises a NOR gate.

4. The circuit of claim 1, wherein:
the first state setting part further comprises a NOR gate; and
the second state setting part further comprises a NOR gate and an inverter.

5. The circuit of claim 1, wherein the second state setting part is further coupled to a third state control signal.

6. The circuit of claim 1, wherein the second control signal further comprises a group control signal.

7. The circuit of claim 1, wherein the first control signal is a power stabilizing signal.

8. The circuit of claim 1, further comprising a mode register configured to store the state control signals.

9. The circuit of claim 1, further comprising:
a plurality of state control signal circuits, each state control signal circuit configured to generate an associated state control signal and including:
a decoder configured to decode an associated plurality of test mode code signals and to generate a decoded signal;
an inverter configured to invert the decoded signal;
a transfer part configured to output a ground voltage in response to the decoded signal and the inverted decoded signal; and
a latch configured to latch the output of the transfer part and to output the associated state control signal.

10. The circuit of claim 9, each state control signal circuit further comprising:
a reset inverter configured to invert a reset signal; and
a transistor having a gate coupled to the reset inverter, a source coupled to a power supply, and a drain coupled to the latch.

11. The circuit of claim 1, wherein the fuse cut signal generator further comprises:
a fuse;
a first transistor having a source coupled to a power supply, a gate configured to receive the first control signal, and a drain coupled to one end of the fuse;
a second transistor having a drain coupled to another end of the fuse, a source coupled to a ground, and a gate configured to receive the first control signal; and
an inverter having an input port coupled to the drain of the second transistor and configured to output the fuse cut signal.

12. A circuit for setting an optimized condition of a semiconductor integrated circuit comprising:
a fuse cut signal generator including a fuse and configured to generate a fuse cut signal in response to a first control signal;
a first state setting part configured to generate a state signal in response to the fuse cut signal and a second control signal; and
a second state setting part configured to generate an optimization signal in response to the state signal and a third control signal.

13. The circuit of claim 12, wherein the second state setting part is further configured to generate a first optimization state on the optimization signal in response to a first control state on the third control signal and to generate the state signal in response to a second control state on the third control signal.

14. The circuit of claim 12, wherein the first control signal is a power stabilizing signal.

15. The circuit of claim 12, further comprising a mode register configured to store the second control signal and the third control signal.

16. The circuit of claim 12, further comprising a second control signal generating circuit comprising:
a decoder configured to decode test mode code signals stored in a mode register of the semiconductor integrated circuit and to generate a decoded signal;
a first inverter configured to invert the decoded signal;
a transfer part configured to transfer a ground voltage in response to the decoded signal and the inverted decoded signal; and
a latch configured to latch an output signal of the transfer part and to generate the select control signal.

17. The circuit of claim 16, wherein the second control signal generating circuit further comprises:
a second inverter configured to invert a reset signal; and
a transistor having a source coupled to a power supply, a gate to receive the inverted reset signal, and a drain coupled to the latch.

18. The circuit of claim 12, further comprising a third control signal generating circuit comprising:
a decoder configured to decode test mode code signals stored in a mode register of the semiconductor integrated circuit and to generate a decoded signal;
a first inverter configured to invert the decoded signal;
a transfer part configured to transfer a ground voltage in response to the decoded signal and the inverted decoded signal; and
a latch configured to latch an output signal of the transfer part and to generate the third control signal.

19. The circuit of claim 18, wherein the third control signal generating circuit further comprises:
a second inverter configured to invert a reset signal; and
a transistor having a source coupled to a power supply, a gate to receive the inverted reset signal, and a drain coupled to the latch.

20. The circuit of claim 12, wherein the fuse cut signal generator comprises:
a first transistor having a source coupled to a power supply, a gate configured to receive the first control signal, and a drain coupled to one end of the fuse;
a second transistor having a drain coupled to another end of the fuse, a source coupled to a ground, and a gate configured to receive the first control signal; and
an inverter having an input port coupled to the drain of the second transistor and configured to output the fuse cut signal.

21. The circuit of claim 12, wherein the first state setting part further comprises a NOR gate configured to receive the fuse cut signal and the second control signal and to generate the first state signal.

22. The circuit of claim 12, wherein the second state setting part further comprises a NOR gate configured to receive the state signal and the third control signal and to generate the second state signal.

23. The circuit of claim 12, wherein the second state setting part is further configured to generate the optimized signal in response to a group control signal.

24. A circuit for setting an optimized condition of a semiconductor circuit comprising:
a fuse cut signal generator configured to generate a fuse cut signal in response to a first control signal;

a state setting circuit configured to generate an optimization signal in response to a plurality of state control signals and the fuse cut signal; and a plurality of state control signal circuits, each state control signal circuit configured to generate an associated state control signal and including:
- a decoder configured to decode an associated plurality of test mode code signals and to generate a decoded signal;
- an inverter configured to invert the decoded signal;
- a transfer part configured to output a ground voltage in response to the decoded signal and the inverted decoded signal; and
- a latch configured to latch the output of the transfer part and to output the associated state control signal.

25. The circuit of claim 24, each state control signal circuit further comprising:
- a reset inverter configured to invert a reset signal; and
- a transistor having a gate coupled to the reset inverter, a source coupled to a power supply, and a drain coupled to the latch.

26. A circuit for setting an optimized condition of a semiconductor circuit comprising:
- a fuse cut signal generator configured to generate a fuse cut signal in response to a first control signal; and
- a state setting circuit configured to generate an optimization signal in response to a plurality of state control signals and the fuse cut signal;

wherein the fuse cut signal generator further comprises:
- a fuse;
- a first transistor having a source coupled to a power supply, a gate configured to receive the first control signal, and a drain coupled to one end of the fuse;
- a second transistor having a drain coupled to another end of the fuse, a source coupled to a ground, and a gate configured to receive the first control signal; and
- an inverter having an input port coupled to the drain of the second transistor and configured to output the fuse cut signal.

* * * * *